United States Patent
Medina et al.

(10) Patent No.: US 8,305,670 B2
(45) Date of Patent: Nov. 6, 2012

(54) MOEMS APPARATUS AND A METHOD FOR MANUFACTURING SAME

(75) Inventors: Moshe Medina, Haifa (IL); Pinchas Chaviv, Hod-HaSharon (IL); Yaron Fein, Rehovot (IL)

(73) Assignee: STMicroelectronics International N.V., Amsterdam (NL)

( * ) Notice: Subject to any disclaimer, the term of this patent is extended or adjusted under 35 U.S.C. 154(b) by 0 days.

(21) Appl. No.: 13/320,828

(22) PCT Filed: May 24, 2009

(86) PCT No.: PCT/IL2009/000516
§ 371 (c)(1),
(2), (4) Date: Nov. 16, 2011

(87) PCT Pub. No.: WO2010/137009
PCT Pub. Date: Dec. 2, 2010

(65) Prior Publication Data
US 2012/0062973 A1    Mar. 15, 2012

(51) Int. Cl.
*G02B 26/08* (2006.01)
(52) U.S. Cl. .............. 359/199.2; 310/309; 359/245
(58) Field of Classification Search .... 359/198.1–199.2, 359/200.6, 221.2, 245, 290–291, 309
See application file for complete search history.

(56) References Cited

U.S. PATENT DOCUMENTS

| 6,713,367 | B2 |   | 3/2004  | Solgaard et al. |
|-----------|----|---|---------|-----------------|
| 7,069,784 | B1 | * | 7/2006  | Eskridge ............ 73/514.29 |
| 2005/0219677 | A1 |   | 10/2005 | Krylov et al. |

FOREIGN PATENT DOCUMENTS

| EP | 1 792 870 A2 | 6/2007 |
| WO | WO2009/026232 A1 | 2/2009 |

OTHER PUBLICATIONS

International Search Report mailed Mar. 31, 2010 in International Application PCT/IL2009/000516, filed May 24, 2009.
Sun et al., A high-aspect-ratio two-axis electrostatic microactuator with extended travel range, Sensors and Actuators A, Elsevier Sequoia S.A., Lausanne, CH vol. 102, No. 1-2, Dec. 1, 2002; pp. 49-60.
Cho et al., Electrostatic 1D Micro Scanner with Vertical Combs for HD resolution Display, Procedures of SPIE, vol. 6466 (2007); pp. 1-12.

* cited by examiner

*Primary Examiner* — James Phan
(74) *Attorney, Agent, or Firm* — Gardere Wynne Sewell LLP

(57) ABSTRACT

A MOEMS apparatus for scanning an optical beam is formed from a double active layer silicon on insulator (DSOI) substrate that includes two active layers separated by an insulating layer. The apparatus includes an electro-static comb drive having a stator formed in a first of the two active layers and a rotor formed in a second of the two active layers. The electrostatic comb drive is operative to impart a tilting motion to a micro-mirror formed in the second active layer. The MOEMS apparatus is designed such that: a) at least one of the distances created between a tooth belonging to the rotor and an adjacent tooth belonging to the stator is less than 7 μm; and the aspect ratio of the apparatus is higher than 1:20.

11 Claims, 3 Drawing Sheets

MOEMS APPARATUS AND A METHOD FOR MANUFACTURING SAME

FIELD OF THE INVENTION

The present invention relates generally to micro opto-electro-mechanical devices and their manufacturing process and more particularly to methods for improving the accuracy of the etching step in the process of manufacturing such devices.

BACKGROUND OF THE INVENTION

Nowadays many MOEMS (Micro Optical Electro-Mechanical Systems) applications use a tilting motion of a deformable element (e.g. element used for tilting micro mirrors). State-of-the-art electrostatic actuating devices are configured with an angular degree of freedom and are driven by electrostatic forces. Electro-static comb drives can be divided to an in-plane comb drive ("IPCD") and vertical comb drive ("VCD").

The IPCD and VCD actuators are used to generalize the working principle of a double-sided comb-drive actuator and to obtain an angular motion. They are constructed from two sets of combs, a moving part (henceforth rotor) and static part (stator) interlaced together, for example the MOEMS illustrated in FIGS. 1A and 1B. The use of the two combs forms a free space capacitor, whereas the motion between the two combs changes the capacity of the free-space capacitor thus formed. Accordingly, upon applying a voltage difference between the stator and rotor combs, it induces vertical electrostatic force that creates a motion. However, in addition to the tilt motion, the voltage difference might also produce unwanted vertical and lateral motions of the mirror. FIG. 1C illustrates an example of a schematic cross-sectional view of the pure rotational actuation. In this example the forces that cause vertical and lateral piston motions are canceled by the symmetric layout of the comb stators. The electro-static forces are generated in the gaps between the combs shown in FIG. 1B. Since the capacity of a capacitor as described above is mainly influenced by its geometric shape, the dimensions of the combs strongly influence the obtained electrostatic force. A larger electrostatic force can be acquired when the aspect ratio increases (the aspect ratio is defined as the ratio between the height of the comb and the distance between every pair of adjacent teeth comprised in the comb).

Several methods are known in the art for fabricating VCD. These prior art methods can generally be segmented to methods for fabricating the VCD from a two device layer wafers, which may be considered as a "self aligned" mode and methods for fabricating each of the combs of the VCD separately, using a different wafer followed by bonding the two (rotor and stator) wafers to create a single VCD. An example of such a self aligned mode for fabricating a VCD is described in U.S. Pat. No. 6,713,367. The method described by this publication includes the steps of etching in a semiconductor wafer a first comb with a coarse set of teeth, then a second semiconductor wafer is bonded to the first set of teeth, and another set of teeth is etched in the second wafer with teeth overlapping the teeth in the first comb. Even though both top and bottom comb teeth of the VCD actuator are defined by a single fabrication mask, the difficulty of this method lies in the fact that it highly depends upon the accuracy of the machine to obtain sufficiently accurate alignment. The problems associated with wafers' bonding method are described in length by Jin-Woo Cho et al in "Electrostatic 1D Micro Scanner with Vertical Combs for HD resolution Display", Proc. Of SPIE vol. 6466. (2007). Basically a relative small divergence (even one that is within the system's tolerance) in aligning both wafers, might result in electric shortage between overlapping comb's teeth. Up to date, current VCD fabrication methods provide VCD having relatively low aspect ratio.

SUMMARY OF THE INVENTION

It is an object of the present invention to provide an electro-static comb drive characterized by having small distances between adjacent comb teeth and by having high accuracy alignment between its two active layers.

It is another object of the present invention to provide an electro-static comb drive with aspect ratio higher than 1:20.

It is still another object of the present invention to eliminate the possibility for electric shortages due to overlapping combs' teeth.

It is a yet a further object of the present invention to provide a method of fabricating an electro-static comb drive having small distances between adjacent comb teeth, thereby enabling to achieve high electrostatic force for actuation when using such a device.

It is still another object of the present invention to provide a fabricating process that allows achieving alignment accuracy that is better than ±0.5 µm.

It is yet another object of the present invention to provide a fabricating process that enables achieving accurate etching through two device layers with unlimited thickness of insulating (oxide) layer therebetween.

Other objects of this invention will become clear as the description of the invention proceeds.

According to a first embodiment of the present invention a MOEMS apparatus is provided which comprises a double active layer silicon on insulator (DSOI) substrate that includes two active layers separated by an insulating layer. The apparatus comprises an electro-static comb drive that includes a stator formed in a first of the two active layers and a rotor formed in the second of the two active layers,
  wherein the MOEMS apparatus is characterized in that:
    at least one of the distances created between a tooth belonging to said rotor and an adjacent tooth belonging to said stator is smaller than 6 µm; and
    the aspect ratio of said apparatus is higher than 1:20.

Although the present invention is described hereinafter as a MOEMS apparatus which comprises a double active layer silicon on insulator (DSOI) substrate, it should be understood to encompass any MOEMS apparatus which comprises more than two active layers of silicon on insulator (DSOI) substrate, as long as at least two of the active layers are characterized as described herein.

According to another embodiment of the invention the electro-static comb drive comprised in the MOEMS apparatus is selected from among a vertical comb drive and an in-plane comb drive.

According to yet another embodiment of the invention each of the rotor and stator comprised in the MOEMS apparatus are etched in with accuracy of ±0.5 µm.

In accordance with yet another embodiment of the invention, the electro-static comb drive is operative under pull-in voltage that is higher than 300V.

According to another aspect of the present invention, there is provided a method for fabricating a MOEMS apparatus from a double active layer silicon on insulator (DSOI) substrate that includes two active layers separated by an insulating layer, the method comprising:
  a. etching in the first active layer a first plurality of designated shapes and at least one cavity adapted to be used as a marker;

b. etching in the second active layer at least one cavity at a location that essentially corresponds to the location of the at least one cavity that has been etched in the first active layer;
c. identifying through the at least one cavity etched in the second active layer, the location of the at least one marker cavity etched in the first active layer;
d. based upon the identification step, determining at least one reference point at the second active layer for etching a second plurality of designated shapes thereat; and
e. in the second active layer, etching a second plurality of designated shapes located at pre-determined distances from the at least one reference point.

According to another embodiment of the present invention, etching the plurality of designated shapes and the at least one marker in the first active layer are carried out simultaneously.

According to another embodiment of the present invention the thickness of the insulating layer (e.g. the oxide layer) that separates the first and second active layers is determined so as to enable light passing through the at least one marker cavity that was etched in the first active layer, to reach the cavity etched in the second active layer.

According to yet another embodiment of the present invention the method further comprising a step of enlarging the at least one cavity etched in the second active layer, in case that one or more of the at least one marker cavities etched in the first active layer have not been properly identified.

According to another embodiment of the present invention the at least one marker cavity is included in the first plurality of designated shapes, thereby saving on the need to etch the at least one marker cavity in addition to the etching of that first plurality of designated shapes.

According to still another embodiment, the method further provided a step of converting the two layers device obtained by etching the first layer and the second layer, into a one layer device, by collapsing these two layers into a one layer device, e.g. by converting a vertical comb drive (VCD) engine into a very high aspect ratio in-plane comb drive (IPCD) engine.

BRIEF DESCRIPTION OF THE DRAWINGS

For a more complete understanding of the present invention, reference is made to the following detailed description taken in conjunction with the accompanying drawings wherein.

DETAILED DESCRIPTION OF PREFERRED EMBODIMENTS

The present invention will be better understood and appreciated more fully when taken in conjunction with the accompanying drawings.

Figure 1A:
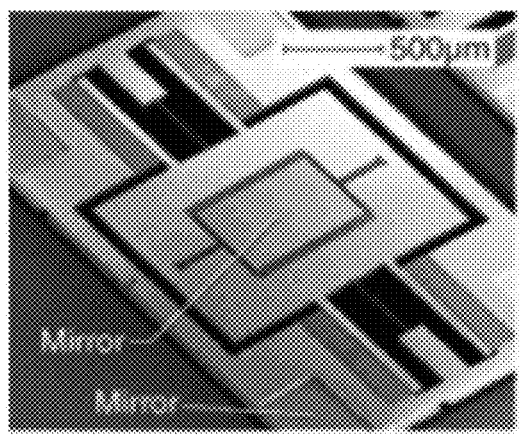
FIGS. 1A and 1B present a typical MEOMS electro-static comb drive.
Figure 1B:
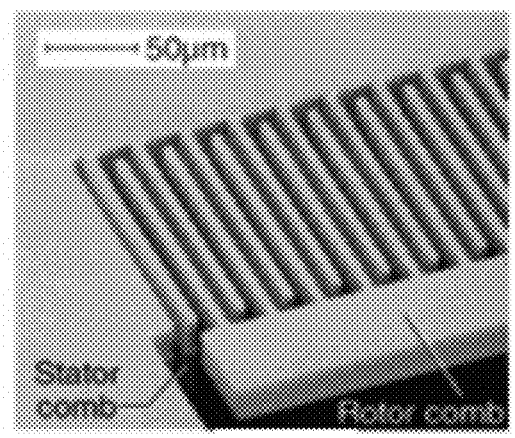
Figure 1C:
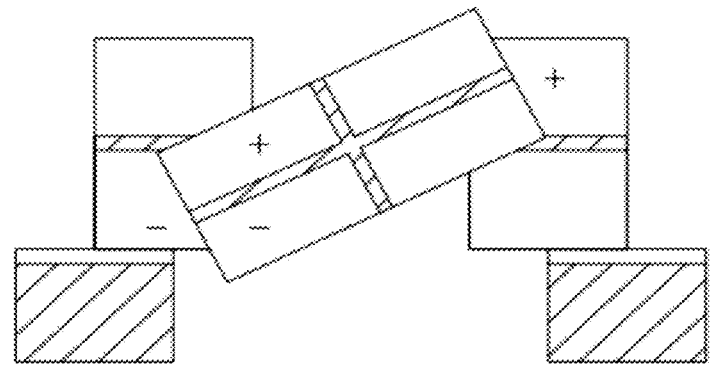
FIG. 1C demonstrates an example of a schematic cross-sectional view of the pure rotation actuation.
Figure 1C:
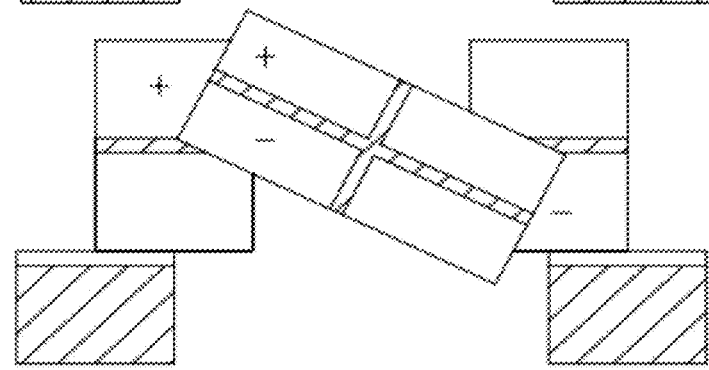
Figure 1D:
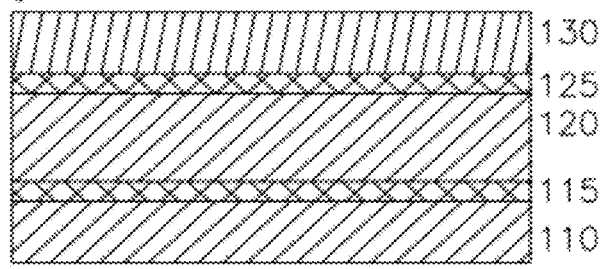
FIG. 1D presents a schematic example of a pre-fabricated DSOI wafer.

Let us first consider FIG. 1D which presents a schematic example of a pre-fabricated commercially available double-active-layer SOI (Double Silicon on Insulator, "DSOI") wafer 100, prior to its processing. The DSOI wafer typically comprises either a substrate and two active layers or a substrate and one active layer, wherein the substrate itself is used as one of the two active layers. The active layer(s) and the substrate are bonded together before the starting of the fabrication process. The DSOI presented in this figure has (from bottom to top) a first active layer 110, an oxide layer 115, a second active layer 120, an oxide layer 125 and a silicon substrate 130. Each of the three semiconductor layers, i.e. first active layer 110, second active layer 120 and substrate 130, is electrically isolated from the other by the respective oxide layer. Oxide layer 115 is located between the first and second active layers, and oxide layer 125 is located between the second active layer and the substrate. Each active layer may have a thickness of few to few tens of microns, whereas the oxide layers are typically narrower than the active layers and their thickness changes from less than a micron to few microns.

The steps of a process used according to the present invention for fabricating a comb structure for vertical comb drive are demonstrated in FIGS. 2A-2F. As will be appreciated by those skilled in the art, the process exemplified herein is one example of fabricating a comb structure for vertical comb drive out of several processes or certain variations in the process described herein, that can be carried out without departing from the scope of the present invention.

Figure 2A:
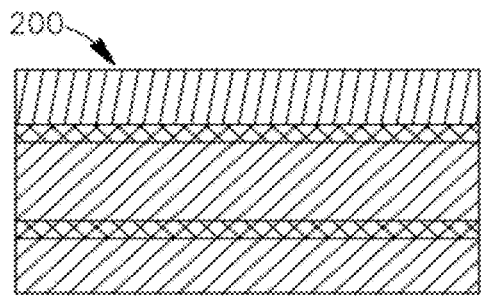
FIGS. 2A to 2F present a schematic side view of the fabrication of the electro-static comb drive.

All dimensions of the respective layers and of resulting product of the process should be understood as being illustrative for demonstration purposes only. A typical wafer 200 is shown in FIG. 2A which comprises two active layers 210 and 220, a substrate layer (handle) 230 and two oxide layers 215 and 225. Oxide layer 215 separates the first active layer 210 from the second active layer 220 whereas a second oxide layer 225 separates the second active layer 220 from substrate 230.

Figure 2D:
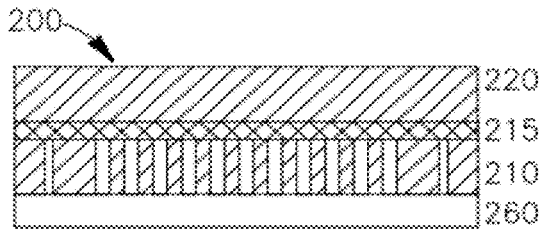
Figure 2B:
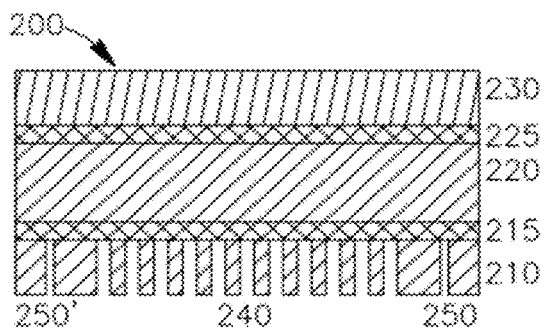
Figure 2E:
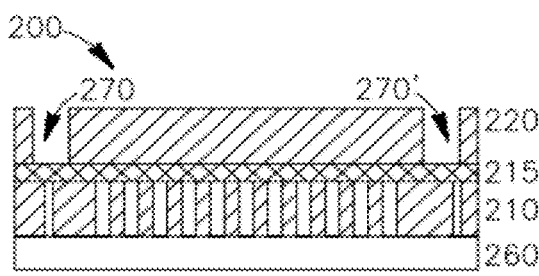
Figure 2C:
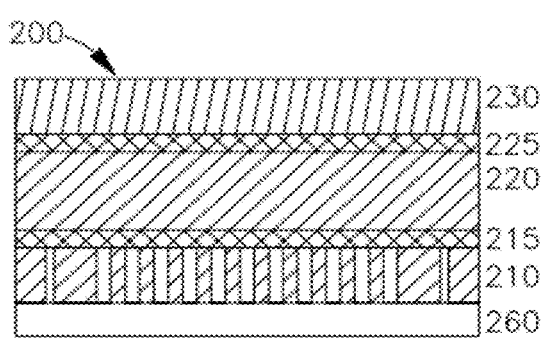
Figure 2F:
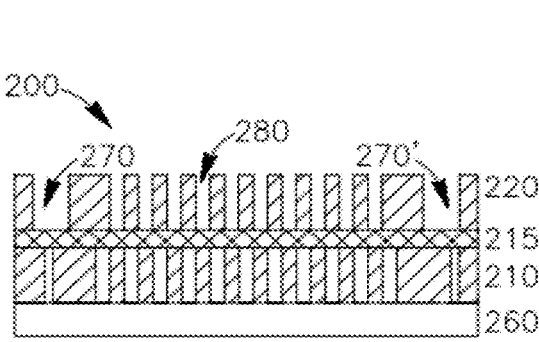

The first step of the process is shown in FIG. 2B, where the first active layer 210 has been etched by applying a dry etch step, or by applying any other suitable process that is known in the art per se, in order to form the teeth of stator 240. As will be appreciated by those skilled in the art, the present invention should not be considered as being limited to which of the active layers would function as the rotor and which as the stator, although in this example active layer 210 is designated to be the stator and active layer 220 is designated to be the rotor. During this step, and in addition to etching the stator teeth, markers 250 and 250' are also being etched. Since this Fig. illustrates a view side of the wafer, only two cavities that are adapted to be used as markers are shown. Preferably, more markers' cavities are used (and located on a different longitudinal axis), to provide a two dimensional match of the mask to be prepared for the etching of the second active layer. The etching of the markers' cavities is carried out up to the oxide layer and is preferably carried out together with the etching of the stator's teeth. The markers' cavities may be etched at pre-defined locations, but in addition or in the alternative, they may be etched in non pre-determined locations but preferably close to the edges of the first active layer (so as not to interfere with the etching of stator 240). In the next step, shown in FIG. 2C, upon etching the markers' cavities 250 and 250' and stator comb teeth 240, a glass layer 260 is bonded to the first active layer 210. Once wafer 200 is bonded to the glass layer 260, the substrate layer 230 and oxide layer 225 are removed as illustrated in FIG. 2D, thereby revealing the second active layer 220. The next step is shown in FIG. 2E where two cavities (270 and 270') were etched in active layer 220. These two cavities are centered approximately in places that would match the centers of the markers' cavities etched in the first active layer. According to the present invention, the accuracy in etching cavities 270 and 270' is not highly important because these cavities are used for providing reference point(s) for etching the second active layer. Once cavities 270 and 270' are etched, markers' cavities 250 and 250' become visible when viewing them from the top surface of the second active layer, i.e. from the surface of the cavities' top apertures, because the oxide layer 215 is very thin hence it is practically transparent. The next step is illustrated in FIG. 2F, where the locations of the markers' cavities are used as reference points for preparing a mask to be used for etching active layer 220 in the exact designated places, so that a precise etching of the rotor comb teeth 280 is achieved. Applying the suggested method allows fabricating a vertical comb drive with an accuracy that is higher than any accuracy that may be achieved while implementing another fabricating method known in the art. The aspect ratio obtained while using the above method was higher than 1:40 and the accuracy obtained better than ±0.5 μm.

Figure 3A:
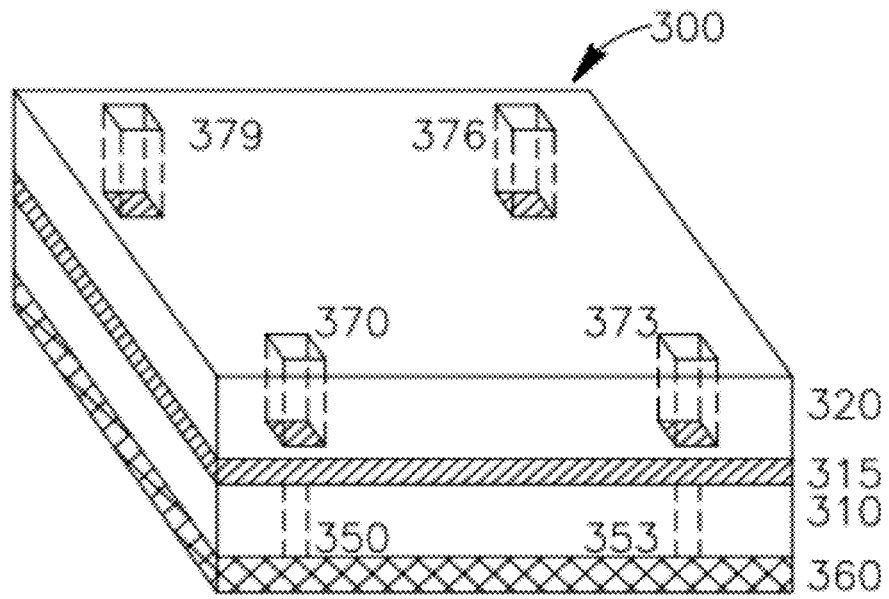
FIGS. 3A and 3B present an example of cavities deployed in a DSOI wafer for use as markers.
Figure 3B:
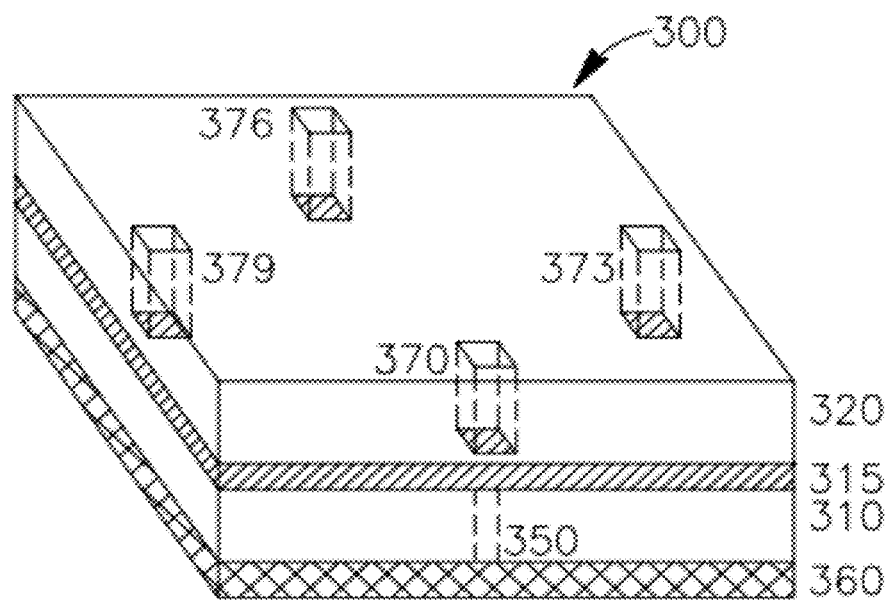

FIGS. 3A and 3B illustrate two examples of deploying markers' cavities according to an embodiment of the invention in a DSOI wafer. These FIGS. show wafer 300 in which various cavities were etched (but without showing the etched rotor comb). The illustrated DSOI wafer, comprises a first active layer 310, a second active layer 320, an oxide layer 315 separating between the first and the second active layers, a glass layer 360 bonded to the active layer 310. Cavities 350, 353 and two other cavities (not shown in this FIG.) are used as marker cavities. Once they are etched, cavities 370, 373, 376 and 379 are etched in the second active layer at locations that essentially match those of marker cavities 350, 373 and the other two marker cavities in the first layer. The etching of cavities 370, 373, 376 and 379 is carried out until reaching oxide layer 315. Thereafter, the exact locations of the centers of the marker cavities are identified and compared each with the centers of the respective cavities etched in the second layer. Upon determining the match between the centers of the marker cavities and the second layer cavities, any offset may be calculated and based thereon, the mask for etching the second layer device is prepared.

A similar process is described in FIG. 3B where the 4 marker cavities (of which only 350 is shown in this FIG.) and their corresponding cavities of the second layer, are located at different positions to enable different way of obtaining reference points for preparing the mask that would allow etching the second active layer with the required accuracy.

The invention claimed is:

1. A MOEMS apparatus manufactured from a double active layer silicon on insulator (DSOI) substrate that includes two active layers separated by an insulating layer, the apparatus comprising:
   an electro-static comb drive that includes a stator formed in said first of the two active layers and a rotor formed in said second of the two active layers,
   wherein:
      at least one distance created between a tooth belonging to said rotor and an adjacent tooth belonging to said stator is smaller than 6 μm; and
      aspect ratio of said apparatus is higher than 1:20.

2. A MOEMS apparatus according to claim 1, wherein said electro-static comb drive is selected from the group consisting of a vertical comb drive, or an in-plane comb drive.

3. A MOEMS apparatus according to claim 1, wherein each of said rotor and stator are etched in with accuracy of ±0.5 μm.

4. A MOEMS apparatus according to claim 1, wherein said electro-static comb drive is operative under a pull-in voltage higher than 300V.

5. A method for manufacturing a MOEMS apparatus from a double active layer silicon on insulator (DSOI) substrate that includes two active layers separated by an insulating layer, comprising:
   a. etching in said first active layer a first plurality of designated shapes and at least one cavity adapted to be used as a marker;
   b. etching in said second active layer at least one cavity at a location that essentially corresponds to a location of said at least one marker cavity that has been etched in said first active layer;
   c. identifying through said at least one cavity etched in said second active layer, said at least one marker cavity etched in said first active layer;
   d. based upon the identification made in step c, determining at least one reference point at said second active layer; and
   e. in said second active layer, etching a second plurality of designated shapes each located at a pre-determined distance from said at least one reference point.

6. A method according to claim 5, wherein etching said first plurality of designated shapes and said at least one marker cavity in said first active layer are carried out simultaneously.

7. A method according to claim 5, wherein a thickness of said oxide layer separating said first and second active layers enables light passing through said at least one marker cavity etched in said first active layer to reach the cavity etched in said second active layer.

8. A method according to claim 5, further comprising enlarging said at least one cavity etched in said second active layer, in case that one or more of said at least one marker cavity etched in said first active layer have not been properly identified.

9. A method according to claim 5, further comprising converting said two layer device obtained by etching said first layer and said second layer into a one layered device.

10. A method according to claim 5, wherein said at least one marker cavity is included in said first plurality of designated shapes.

11. A method according to claim 5, further comprising collapsing the two layers device obtained by etching said first layer and said second layer into a one layered device.

* * * * *